(12) United States Patent
Liu

(10) Patent No.: US 6,944,844 B2
(45) Date of Patent: Sep. 13, 2005

(54) SYSTEM AND METHOD TO DETERMINE IMPACT OF LINE END SHORTENING

(75) Inventor: Hua-Yu Liu, Palo Alto, CA (US)

(73) Assignee: Synopsys, Inc., Mountain View, CA (US)

( * ) Notice: Subject to any disclaimer, the term of this patent is extended or adjusted under 35 U.S.C. 154(b) by 93 days.

(21) Appl. No.: 10/116,661

(22) Filed: Apr. 3, 2002

(65) Prior Publication Data

US 2003/0192012 A1 Oct. 9, 2003

(51) Int. Cl.⁷ .............................................. G06F 17/50
(52) U.S. Cl. ................................ 716/19; 716/2; 716/4; 716/20; 703/14; 430/5
(58) Field of Search ........................... 716/2, 4, 19, 20, 716/21, 11; 703/14; 430/5

(56) References Cited

U.S. PATENT DOCUMENTS

| | | | |
|---|---|---|---|
| 5,801,954 A | | 9/1998 | Le et al. ...................... 364/488 |
| 6,077,310 A | * | 6/2000 | Yamamoto et al. ........... 716/19 |
| 6,081,659 A | | 6/2000 | Garza et al. ........... 395/500.22 |
| 6,453,457 B1 | * | 9/2002 | Pierrat et al. .................. 716/19 |
| 6,553,560 B2 | * | 4/2003 | Ma et al. ....................... 716/19 |
| 6,562,638 B1 | * | 5/2003 | Balasinski et al. ............. 716/19 |
| 2003/0061587 A1 | * | 3/2003 | Zhang et al. .................. 716/11 |
| 2004/0081899 A1 | * | 4/2004 | Misaka ........................... 430/5 |

FOREIGN PATENT DOCUMENTS

| | | |
|---|---|---|
| WO | WO 99/14638 A1 | 3/1999 |
| WO | WO 00/67075 A1 | 11/2000 |
| WO | WO 00/67076 A1 | 11/2000 |

OTHER PUBLICATIONS

Cai, L., et al., "Enhanced Dispositioning of Reticle Defects Using the Virtual Stepper with Automated Defect Severity Scoring", Numerical Technologies, Inc., Advanced Micro Devices, Inc., pp. 1–12.

Ronsc. K., et al., "Thin Film Interference Effects in Phase Shifting Masks Causing Phase and Transmittance Errors", IMEC (15 pages).

Casey, Jr., J.D., et al., "Chemically Enhanced FIB Repair of Opaque Defects on Molybdenum Silicide Photomasks", SPIE, vol. 3236, pp. 487–497 (1997).

Henke, W., et al., "A Study of Reticle Defects Imaged Into Three–Dimensional Developed Profiles of Positive Photoresist Using the Solid Lithography Simulator", Microelectronics Eng., vol. 14, pp. 283–297 (1991).

Ham, Y.M., et al., "Dependence of Defects in Optical Lithography", Jpn. J. Appl. Phys., vol. 31, pp. 4137–4142 (1992).

Watanabe, H., et al., "Detection and Printability of Shifter Defects in Phase–Shifting Masks II Defocus Characteristics". Jpn. J. Appl. Phys., vol. 31, pp. 4155–4160 (1992).

(Continued)

*Primary Examiner*—Thuan Do
(74) *Attorney, Agent, or Firm*—Bever, Hoffman & Harms, LLP; Jeanette S. Harms

(57) ABSTRACT

A critical dimension, or width, of a feature, or a semiconductor device, can be measured to provide direct and meaningful information regarding the impact of line end shortening, or length, on the function of the device. Specifically, a location on the feature where the width will have an impact on device performance can be selected. Using a simulation, the width at that location can be computed. Given the difficulties of direct measurement of line end shortening and the relationship between the width measurement and the impact on device performance, better layout checking is facilitated than by standard measurements of line end shortening.

28 Claims, 8 Drawing Sheets

OTHER PUBLICATIONS

Nistler, J., et al., "Phase Shift Mask Defect Printability Analysis", Proceedings Of The Microlithography Seminar INTERFACE '93, OCG Microelectronic Materials, Inc., pp. 11–28 (1993).

Spence, C., et al., "Automated Determination of CAD Layout Failures Through Focus: Experiment and Simulation", SPIE, vol. 2197, pp. 302–313 (1994).

Karklin, L., "A Comprehensive Simulation Study of the Photomask Defects Printability", SPIE, vol. 2621, pp. 490–504 (1995).

Gans, F., et al., "Printability and Repair Techniques for DUV Photomasks", SPIE, Proceedings Of The 17th Annual Symposium On Photomask Technology And Management, vol. 3236, pp. 136–141 (1997).

Ibsen, K., et al., "Clear Field Reticle Defect Diposition for Advanced Sub–Half Micron Lithography", SPIE, Proceedings Of The 17th Annual Symposium On Photomask Technology And Management, vol. 3236, pp. 124–135 (1997).

Gordon, R., et al., "Design and Analysis of Manufacturable Alternating Phase–Shifting Masks", Bacus News, vol. 14, Issue 12, pp. 1–9, Dec. 1998.

Chen, et al., "ArF (193nm) Alternating PSM Quartz Defect Repair and Printability for 100nm Node", BACUS Photomask Technology, Sep. 21, 2001 (20 pages).

* cited by examiner

SYSTEM AND METHOD TO DETERMINE IMPACT OF LINE END SHORTENING

BACKGROUND OF THE INVENTION

1. Field of the Invention

The invention relates to analyzing printed image distortion, and in particular to a system and method of determining the impact of line end shortening in the production of integrated circuits.

2. Description of the Related Art

FIG. 1A illustrates a standard layout structure 100 for forming a transistor. Specifically, layout structure 100 includes a gate 101 and two diffusion areas 102, which form the source and drain of the transistor. A first portion of gate 101 that extends past diffusion areas 102 and then terminates without connection is defined as an endcap margin 103, whereas a second portion of gate 101 that extends past diffusion areas 102 and connects to other structures is defined as a fieldcap margin 104.

One form of image distortion is line end shortening, wherein a feature is less than its nominal length when a feature on a mask (or reticle) is transferred to a wafer. Line end shortening can be caused by diffraction, imperfect mask patterns (i.e. line rounding), resist, other processing effects, and/or combinations of one or more effects. FIG. 1B illustrates that line end shortening of gate 101 can cause an ideal printed line end 106, with endcap margin 103, to transfer to a wafer as actual printed line end 105. Note that actual endcap margin 107 of actual printed line end 105 is clearly less than endcap margin 103. Note further that line end shortening has greater effect on certain portions of the line end. Specifically, actual printed line end 105 also has rounded corners due to other optical effects. Thus, the impact of line end shortening is accentuated on the edges of gate 101 that will interface with diffusion areas 102 during operation of the transistor formed by gate 101 and diffusion areas 102.

The rounded corners of a gate can adversely impact transistor performance, as shown in FIG. 1C. For example, if an endcap margin 110 of a gate 108 is sufficiently small or the line end shortening is sufficiently great, then line end shortening (as indicated by actual printed line end 109) can decrease the flow of electrons between diffusion areas 111 when a predetermined voltage is applied to gate 108 (i.e. the transistor formed by gate 108 and diffusion areas 111 is turned "on"). Specifically, the corner rounding of actual printed line end 109 reduces the area over which electrons can travel. This corner rounding can also cause leakage currents in the transistor, thereby resulting in a defective device.

To solve such problems associated with line end shortening, design rules have been used that recommend minimum endcap margins in the layout. However, due to corner rounding variations and the assumption of worst-case scenarios, this endcap margin can be undesirably long, thereby reducing the silicon area available for other circuits.

FIG. 2A illustrates a method sometimes employed by wafer houses to measure the effect of line end shortening. For illustration purposes, the transistor formed by gate 101 and diffusion areas 102 (FIG. 1B) is shown relative to another transistor formed by a gate 101' and diffusion areas 102' (wherein these transistors substantially mirror each other). In this method, instead of measuring the total length of gates 101 and 101', or their respective endcap margins (wherein either measurement can be inaccurate due to the corner rounding), the spacing between line ends is measured. For example, in the case of gates 101 and 101', an ideal separation 201 can instead transfer to a wafer as an actual separation 202. However, even if actual separation 202 can be accurately determined, additional analysis is still required to determine the impact of the line end shortening.

Specifically, although actual separation 202 in FIG. 2A can be acceptable (i.e. resulting in no defective devices), the identical separation in another configuration can result in one or more defective devices. For example, FIG. 2B illustrates two transistors: one transistor formed from gate 101 and diffusion areas 102 and another transistor formed from gate 108 and diffusion areas 107. Note that the measured distance between gates 101 and 108 (i.e. ideal separation 201) and the measured distance between actual printed line ends 105 and 109 (i.e. actual separation 202) are identical to those in FIG. 2A. However, in FIG. 2B, line end shortening can impact the functioning of the transistor formed by gate 108 and diffusion areas 107, but not the transistor formed by gate 101 and diffusion areas 102. Thus, an actual separation measurement cannot provide a reliable indication of the impact of line end shortening.

Therefore, a need arises for a method of accurately determining the impact of line end shortening.

SUMMARY OF THE INVENTION

In accordance with one aspect of the invention, a width (also called a critical dimension) of a feature can be measured to determine the impact of line end shortening. The critical dimension, unlike measuring the separation between ends of two adjacent features, provides meaningful information regarding the impact of line end shortening. Moreover, unlike measuring the length of a shortened line end and its attendant inaccuracies due to rounded corners, the critical dimension can provide direct and accurate information that relates to device performance.

In one embodiment, obtaining this critical dimension can include determining a layout distance associated with the feature. The layout distance indicates a location on the feature associated with device performance. For example, if the feature is a gate, then the location can be associated with an edge of diffusion areas in the layout. Thus, in this example, device performance is related to a transistor formed by the gate and the diffusion areas. Specifically, the location on the feature can indicate a portion of the gate over which electrons could flow during operation of the gate.

In one embodiment, the printing of evaluation points on the feature at the location can be simulated. The distance between these evaluation points can then be measured, wherein the distance is the critical dimension of the feature. In one embodiment, if the critical dimension is less than 10% of a desired critical dimension for the feature, then device performance can be impaired. This methodology can be repeated for other layout distances associated with the feature to provide further line end shortening impact information.

A system and/or a computer program product can implement this methodology. In one embodiment, a simulation report regarding one or more features on a layout can be provided. At least one feature on the layout is a line. The simulation report can include the critical dimension of the line, wherein the critical dimension indicates an impact of line end shortening on the line. The simulation report can further include a graphical output illustrating two deviation notches on the line (which correspond to the evaluation points), wherein the two deviation notches can be used to measure the critical dimension. In one embodiment, the critical dimension is measured at a location on the line coincident with an edge of another feature on the layout. For example, the line can be a gate and the other feature on the layout can be a diffusion area. The edge of the diffusion area can be a layout location with or without process deviation.

DETAILED DESCRIPTION OF THE FIGURES

In accordance with one feature of the invention, a critical dimension of the feature can be measured to determine the impact of line end shortening. The critical dimension measurement advantageously provides accurate and meaningful information regarding device performance irrespective of endcap margin.

Figure 1A:
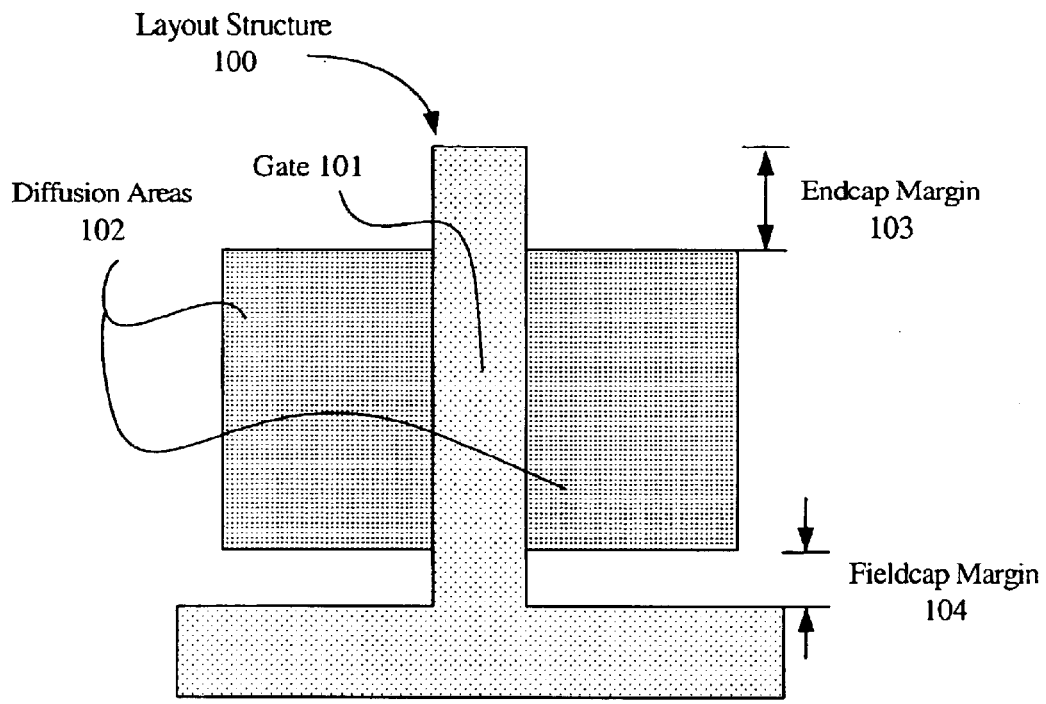
FIG. 1A illustrates a transistor formed by a gate and two diffusion areas.
Figure 1B:
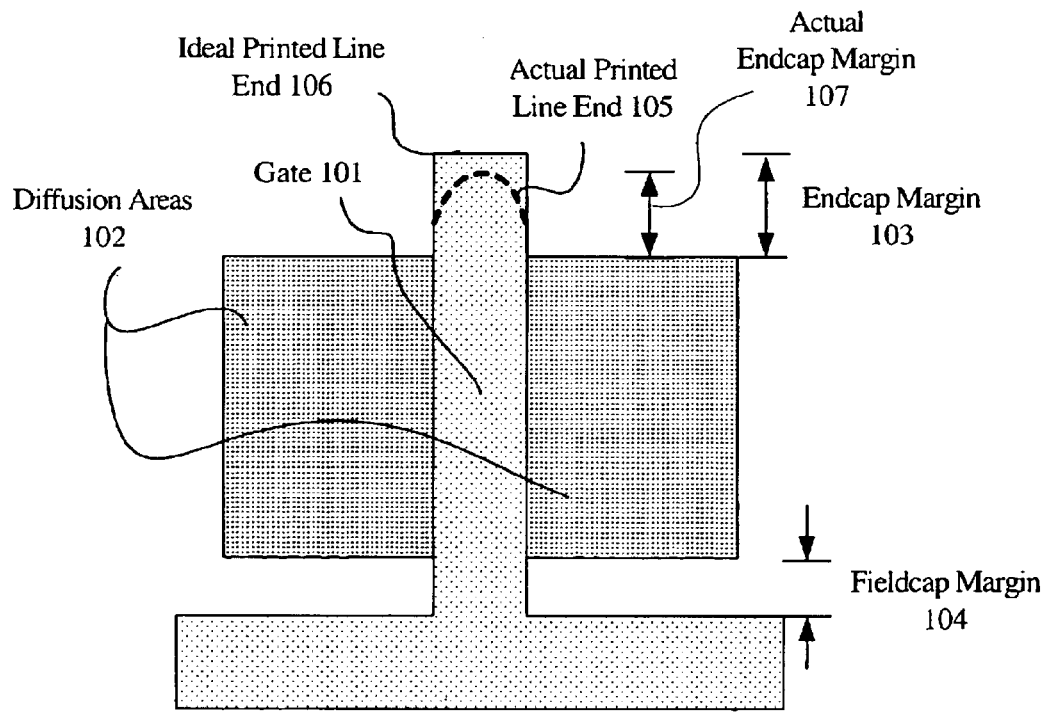
FIG. 1B illustrates the effect of line end shortening on the gate shown in FIG. 1A.
Figure 1C:
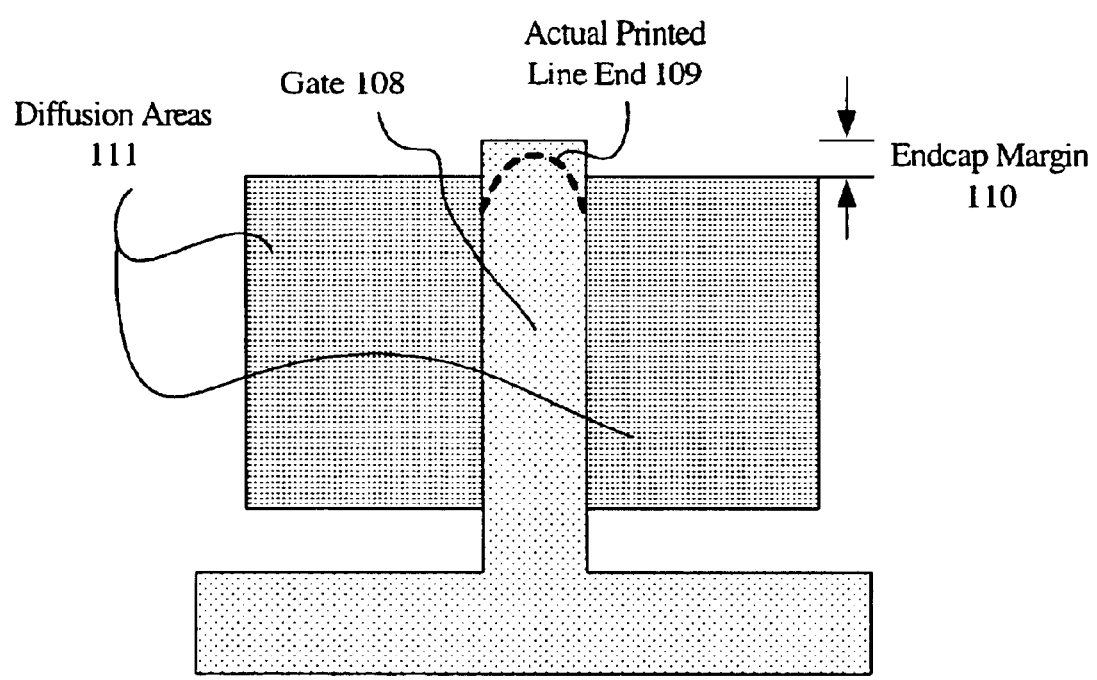
FIG. 1C illustrates the effect of line end shortening if the endcap margin is too small.
Figure 2A:
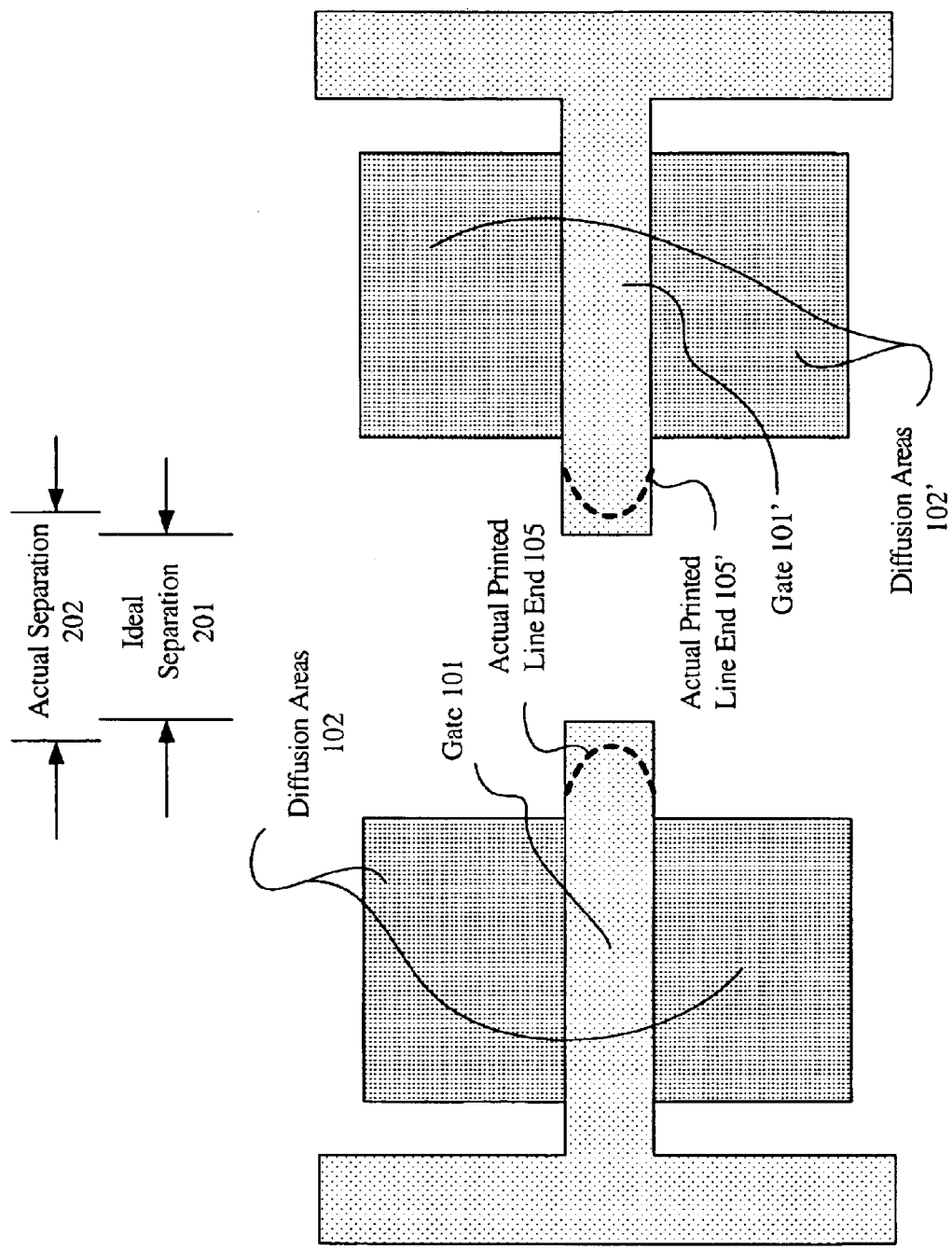
FIG. 2A illustrates a known method of measuring line end shortening for two transistors.
Figure 2B:
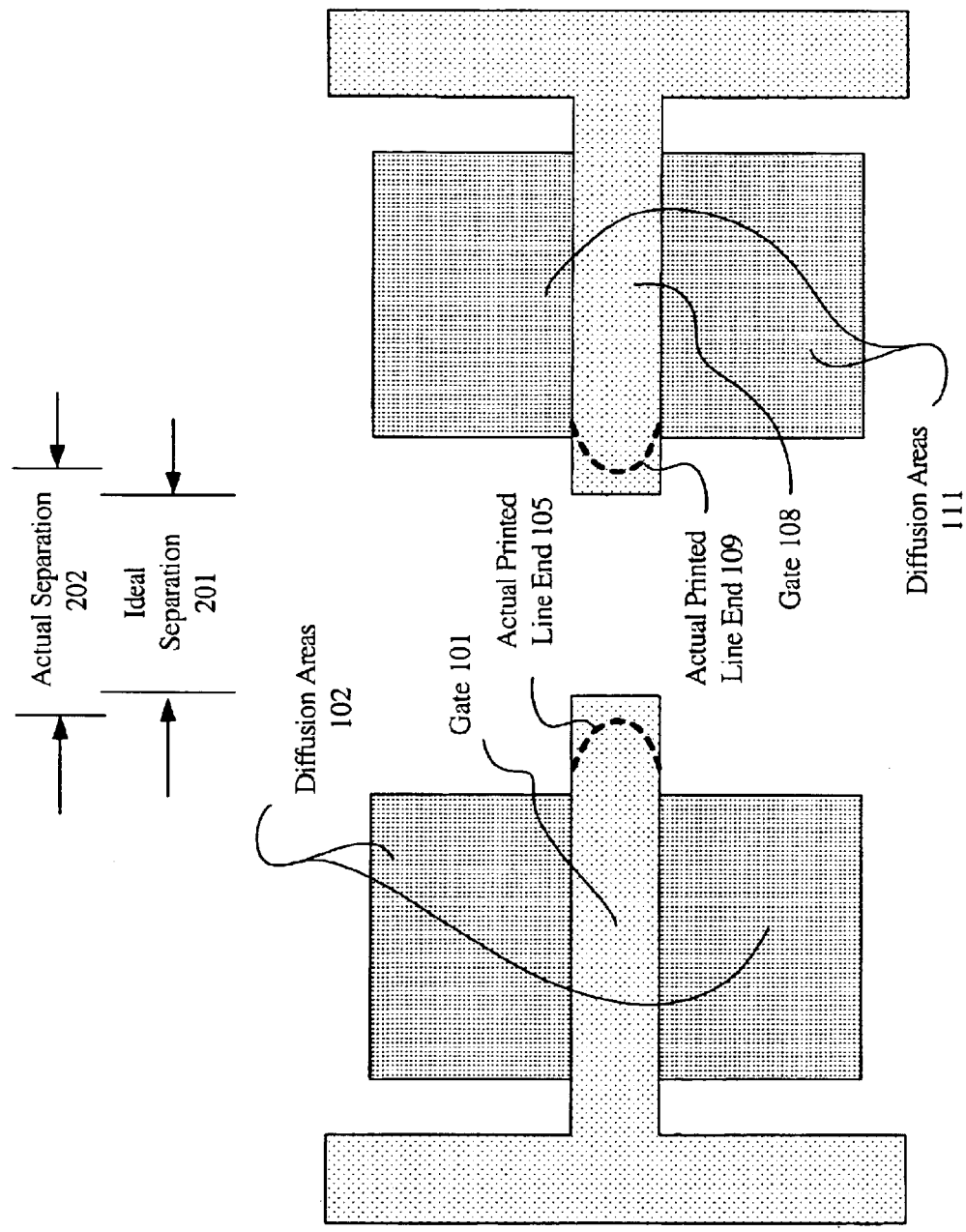
FIG. 2B illustrates how the method shown in FIG. 2A to measure line end shortening fails to accurately assess the impact of line end shortening.
Figure 3A:
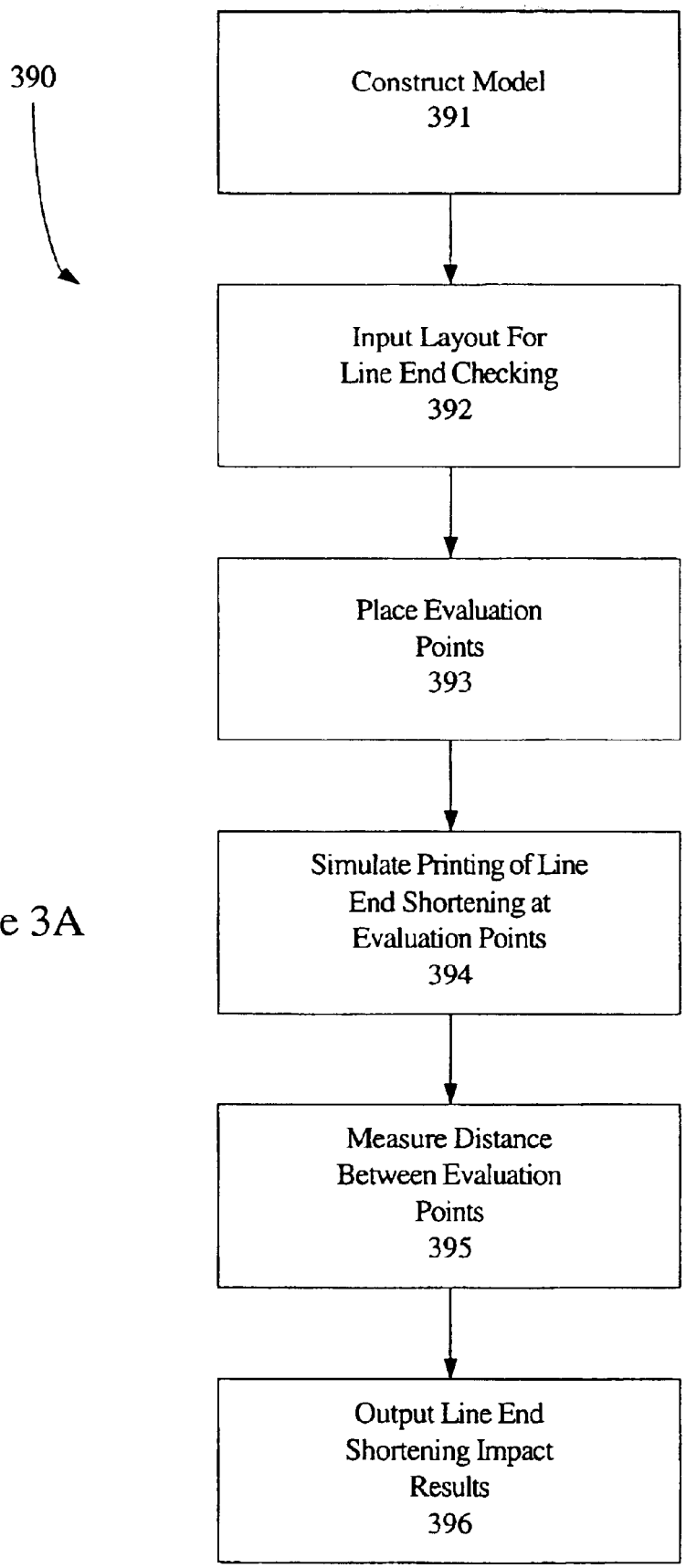
FIG. 3A illustrates one method of determining the impact of line end shortening.

FIG. 3A illustrates one exemplary methodology 390 for obtaining this critical dimension. In step 391, a model can be constructed. The model can be developed based on the equipment, equipment settings, and other parameters used in the fabrication process. The model can be built by performing the fabrication process one or multiple times with test patterns, observing the actual features printed using these test patterns, and fitting a set of equations or matrix transformations that most nearly reproduce the locations of edges of features actually printed as output when the test pattern is provided as input. In one embodiment, the ModelGen™ and/or ModelCal™ tools from Numerical Technologies, Inc. of San Jose, Calif., can be used to create suitable models.

A model uses computational resources in proportion to the number of evaluation points where layout analysis is performed, e.g. approximately O(n) in the number of evaluation points. Specifically, to provide time efficient yet accurate results, the model can be run at selected points, i.e. the evaluation points, located on the edges of features, to determine the correction needed, if any, at each evaluation point to more closely approximate the desired design.

In step 392, the layout to be analyzed can be input into [TOOL?] for line end checking. After line ends are identified, certain evaluation points, called line end shortening evaluation points, can be placed on the features of the layout in step 393. In step 394, the printing of the line end shortening evaluation points can be simulated. Note that the process of using the model with the layout at the evaluation points is called a simulation (or a model if resist and optical effects are also computed). The distance between the simulated line end shortening evaluation points can be measured in step 395, wherein the distance is the critical dimension. Finally, in step 396, line end shortening impact results can be output.

Figure 3B:
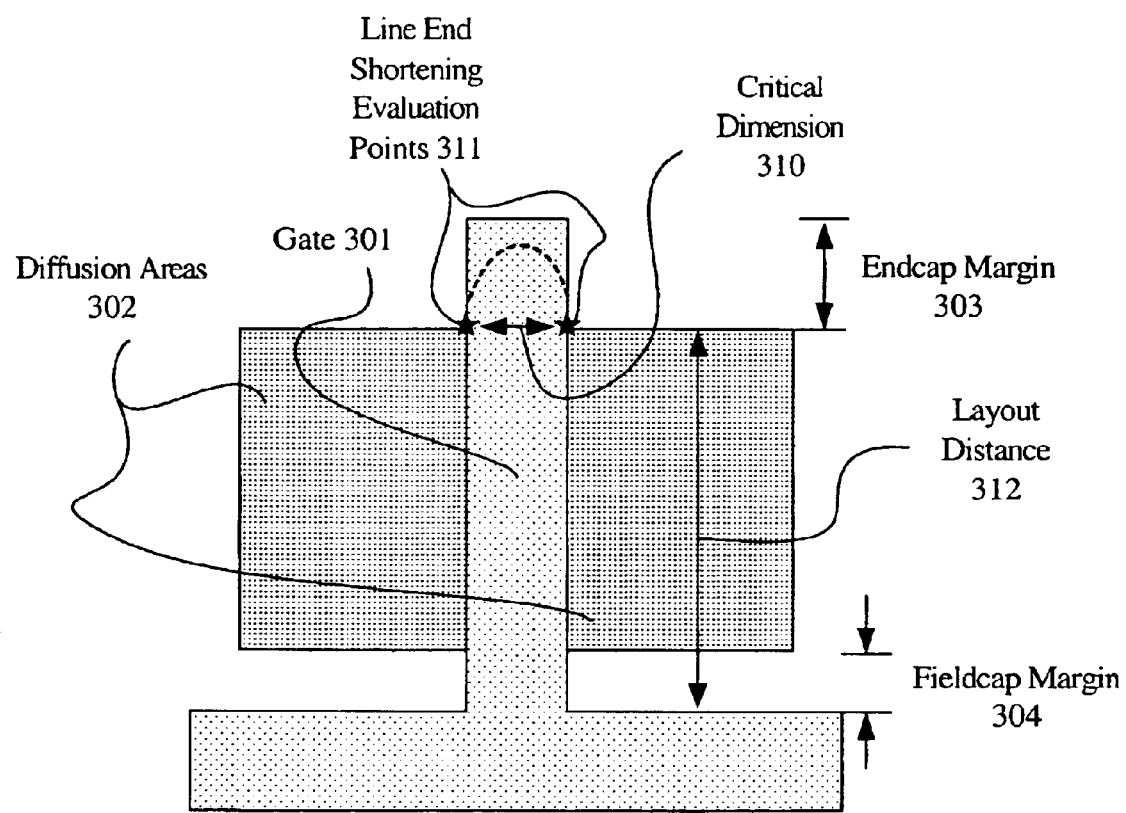
FIG. 3B illustrates a layout feature, wherein the critical dimension of the feature can determine the impact of line end shortening.
Figure 3C:
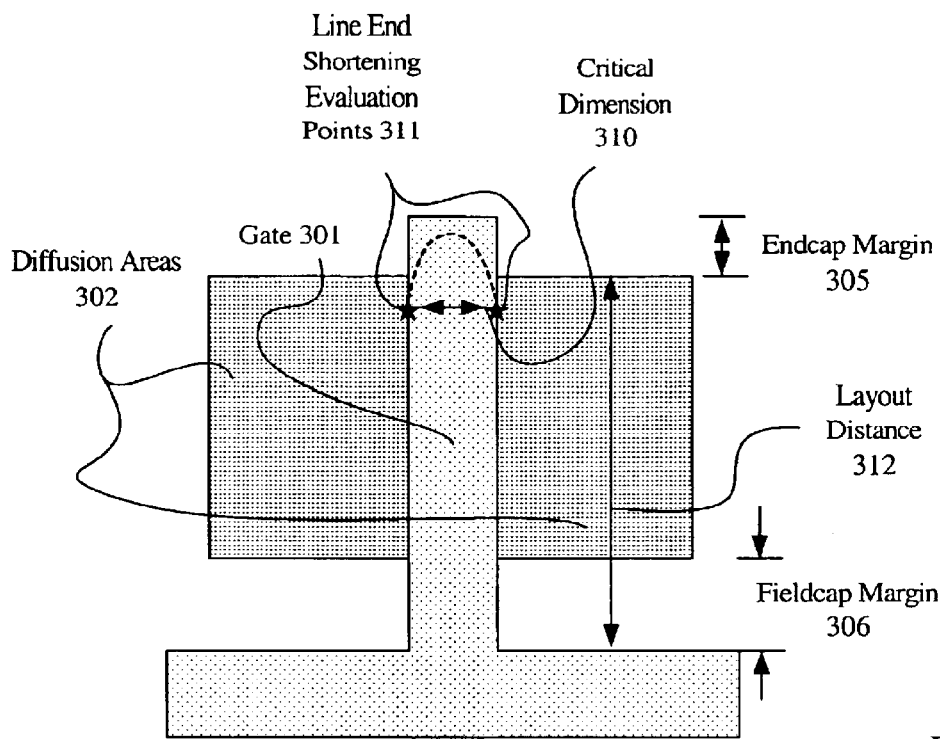
FIG. 3C illustrates the layout feature of FIG. 3B assuming some process deviation.
Figure 3D:
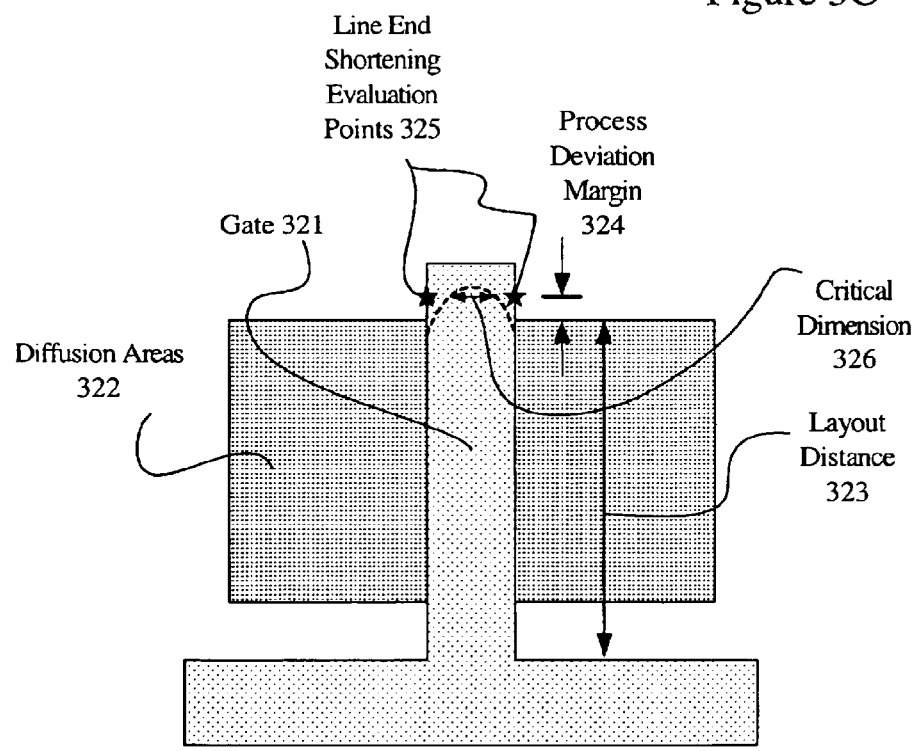
FIG. 3D illustrates another layout feature, wherein a process deviation margin can be used to position the line end shortening evaluation points.

FIGS. 3B–3D illustrate layouts including simplified features. These layouts also illustrate the line end shortening evaluation points that can be used to determine the critical dimension of those features. The placement (step 393) of these line end shortening evaluation points as well as their simulated printing (step 394) are described in reference to FIGS. 3B–3D.

FIG. 3B illustrates a layout including a transistor formed by a gate 301 and diffusion areas 302. This transistor has an endcap margin 303 and a fieldcap margin 304. In one embodiment, a layout distance 312 can be provided, wherein layout distance 312 corresponds to the length of gate 301 at which the edges of diffusion areas 302 would theoretically cross gate 301 (corresponding to endcap margin 303 as opposed to fieldcap margin 304). Line end shortening evaluation points 311 can be positioned on opposite edges of the feature, i.e. gate 301, at layout distance 312.

In accordance with one feature of the invention, line end shortening evaluation points 311 can be used in a simulation to provide a critical dimension 310 of gate 301 at layout distance 312. Note that assuming a perfect process, i.e. no process deviations, critical dimension 310 is the most appropriate dimension to consider the impact of line end shortening on gate 301. In other words, if the measured critical dimension 310 is substantially less than the desired critical dimension, then the line end shortening of gate 301 can be accurately characterized as adversely affecting functionality (e.g. by decreasing the flow of electrons across diffusion regions 302). Moreover, the deviation from this ideal critical dimension can accurately correlate to device performance.

However, in the event that process deviations occur, line end shortening evaluation points 311 may be positioned at a location that is not coincident with the edges of diffusion areas 302. Process deviations could include, for example, diffusion area misalignment, an overlay error between gate and diffusion areas, and a gate narrowing error (which is a separate issue from necking, i.e. an problem resolved by critical dimension control). Any of these process deviations could cause a less than optimal positioning of line end shortening evaluation points 311.

FIG. 3C illustrates a diffusion misalignment error in which diffusion areas 302 could be slightly higher relative to gate 301, thereby decreasing endcap margin 303 and increasing fieldcap margin 304 (see FIG. 3B). Specifically, endcap margin 303 could be reduced to endcap margin 305 and fieldcap margin 304 could be increased to fieldcap margin 306. In this case, critical dimension 310 can still provide limited information regarding the impact on device performance, particularly if the line end shortening is significant. However, additional and/or alternative information can be generated to account for process deviations, thereby ensuring that the impact of line end shortening is fully analyzed.

Specifically, FIG. 3D illustrates another embodiment in which a critical dimension 326 of a gate 321 is measured at a predetermined distance away from diffusion areas 322. Specifically, a process deviation margin 324 can determine the position of line end shortening evaluation points 325 on gate 321 relative to a layout distance 323. Process deviation margin 324 can be based on stepper accuracy, mask alignment accuracy, and/or dimension control of active regions. In one embodiment, process deviation margin 324 is approximately in the range of 20–30 nm.

In this embodiment, if critical dimension 326 is less than the ideal critical dimension of gate 321, then line end shortening has occurred. Moreover, this critical dimension 326 can accurately provide the impact of such line end shortening on the performance of the associated transistor. For example, in one embodiment, if critical dimension 326 is less than 10% the ideal critical dimension of gate 321, then the transistor formed by gate 321 and diffusion areas 322 can be designated a defective transistor.

In one embodiment, a simulation tool, such as the SiVL® tool licensed by Numerical Technologies, Inc., can determine layout distance 323, process deviation margin 324, the location of line end shortening evaluation points 325, and critical dimension 326 as well as the target critical dimension and tolerance (i.e. the amount the critical dimension can acceptably vary). Note that the simulation tool can assume typical process deviations to determine process deviation margin 324 or can also receive user/system input regarding specific process deviations based on the equipment, equipment settings, and other parameters to be used in the fabrication process.

Figure 4A:
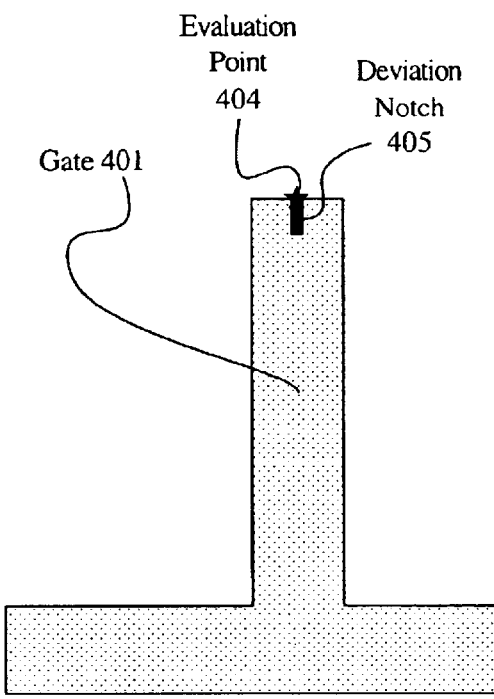
FIG. 4A illustrates an exemplary simulation output for a gate, wherein the simulation was performed using line end shortening evaluation points.
Figure 4B:
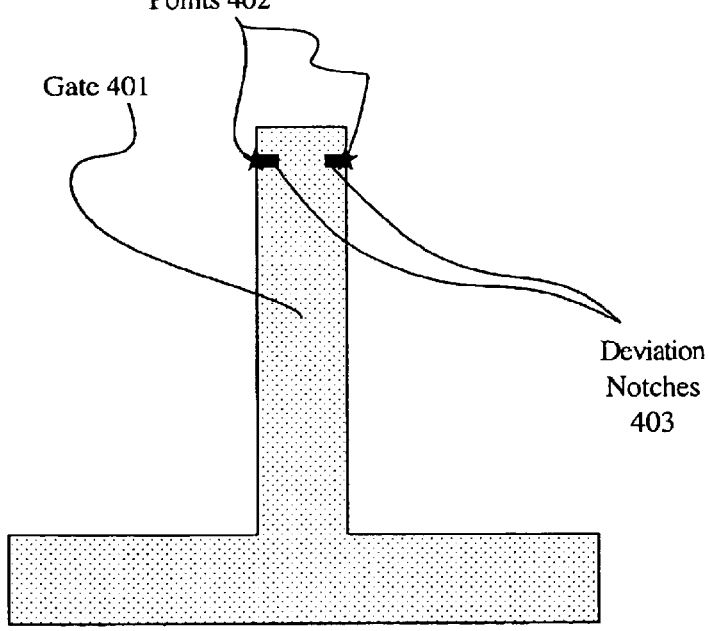
FIG. 4B illustrates a prior art simulation output for a gate, wherein the simulation was performed using an evaluation point on a line end.

In one embodiment, the simulation can provide a deviation (see step 306 of FIG. 3A), which indicates a printed edge location relative to a layout edge location. For example, FIG. 4A illustrates an exemplary calibrated output generated by a simulation tool. Specifically, a simulation of a gate 401 having an evaluation point 404 could generate a report showing a deviation notch 405, wherein the magnitude of deviation notch 405 indicates the location of the simulated printed edge corresponding to evaluation point 404. However, deviation notch 405 can only provide indirect information regarding the impact of line end shortening. Therefore, in another embodiment, the simulation can advantageously generate supplemental information based on such calibrated output. For example, FIG. 4B illustrates the use of line end shortening evaluation points 402 to provide valuable supplemental information. Specifically, a simulation of gate 401 having line end shortening evaluation points 402 could generate a report showing corresponding deviation notches 403, wherein the distance between deviation notches 403 is the critical dimension of simulated printed gate 401.

Note that a mask for fabricating an integrated circuit that accounts for line end shortening can have different gate lengths. Specifically, at least one gate can have a length based on a set endcap margin, wherein the set endcap margin is determined by an impact of line end shortening on the gate. This length can be less than one based on a defined endcap margin provided by a design rule.

Using a mask that accounts for line end shortening also generates an integrated circuit (IC) with distinct features. For example, an active region of at least one transistor of the IC can be positioned relative to a gate of that transistor based on the set endcap margin. Although the set endcap margin is less than the defined endcap margin provided by the design rule, the gate can still function properly during operation of the transistor. In one embodiment, the gate has a critical dimension measured at an edge of the active region substantially equal to a target critical dimension. In another embodiment, the critical dimension is not substantially less than 10% of the target critical dimension.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, the simulation tool can also generate contours of printed features including the gates being simulated. In one implementation, the SiVL tool can operate in combination with another simulation tool licensed by Numerical Technologies, Inc., IC Workbench™, to generate such aerial images. In some embodiments, the aerial image view of the IC Workbench tool has the same functionality for local, small layout regions that are manually selected. The contours could illustrate line end shortening as well as other distortions of the printed features including proximity effects, line width variation (i.e. non-linearity), and corner rounding. Note that the methods described herein can be applied to any lithographic process technology, including ultraviolet, deep ultraviolet (DUV), extreme ultraviolet (EUV), x-ray, and ebeam. Accordingly, it is intended that the scope of the invention be defined by the following claims and their equivalents.

What is claimed is:

1. A method of determining an impact of line end shortening in a layout, the method comprising:
   identifying a transistor in the layout;
   identifying a gate of the transistor;
   identifying a diffusion area of the transistor;
   determining a layout distance associated with the gate, the layout distance indicating a first location on the gate associated with device performance and based on the diffusion area, wherein the first location is outside the diffusion area a predetermined distance;
   simulating printing of predetermined points on the gate; and
   measuring a first critical dimension at the first location based on the simulating, wherein the first critical dimension indicates the impact of line end shortening.

2. The method of claim 1, wherein the predetermined distance is determined by a process deviation margin.

3. The method of claim 1, wherein the first location is coincident with a predetermined distance from the diffusion area in the layout.

4. The method of claim 1, wherein the first location indicates a portion of the gate over which electrons would not, without process deviation, flow during operation of the gate.

5. The method of claim 1, wherein simulating includes analyzing evaluation points on the gate at the first location.

6. The method of claim 5, wherein measuring the first critical dimension includes computing a distance between the evaluation points.

7. The method of claim 5, wherein measuring the first critical dimension includes measuring a distance between deviation notches associated with the evaluation points.

8. The method of claim 1, further including:
   measuring a second critical dimension at a second location on the gate based on the simulating, the second location being coincident with an edge of the diffusion area, wherein the second critical dimension indicates the impact of line end shortening.

9. An integrated circuit including;
a plurality of transistors,
wherein an active region of at least one transistor is positioned relative to a gate of the at least one transistor based on a set endcap margin, the set endcap margin being determined by line end shortening of the gate, the line end shortening being determined by simulating printing of predetermined points on the gate, and
wherein the set endcap margin is less than a defined endcap margin provided by a design rule, yet allows functioning of the gate during operation of the at least one transistor.

10. The integrated circuit of claim 9, wherein the gate has a critical dimension at an edge of the active region, the critical dimension being substantially equal to a target critical dimension.

11. The integrated circuit of claim 9, wherein the gate has a critical dimension at an edge of the active region, the critical dimension being not substantially less than 10% of a target critical dimension.

12. A system for determining an impact of line end shortening for a gate, the system comprising:
means for determining a layout distance associated with the gate, the layout distance indicating a first location on the gate associated with an endcap margin of the gate;
means for simulating printing of predetermined points on the gate; and
means for measuring a first critical dimension at the first location and a second critical dimension at a second location using an output of the means for simulating, wherein the second location on the gate is located a predetermined distance from an end of the gate, wherein the predetermined distance is less than the endcap margin, and wherein the first critical dimension and the second critical dimension indicate the impact of line end shortening.

13. The system of claim 12, wherein the means for simulating includes means for analyzing evaluation points on the gate at the first location and the second location.

14. The system of claim 13, wherein means for measuring the first and second critical dimensions includes means for measuring a distance between deviation notches associated with the evaluation points.

15. The system of claim 12, wherein the second location is determined by a process deviation margin.

16. A computer program product comprising:
a computer usable medium having a computer readable program code embodied therein for causing a computer to assess an effect of line end shortening, the computer readable program code comprising:
computer readable program code that determines a layout distance of a line, the layout distance indicating a first location on the line associated with device performance and an active area of the device;
computer readable program code that simulates printing of predetermined points on the line; and
computer readable program code that measures a critical dimension at the second location using a simulation output, wherein the second location is between the first location and an end of the line, wherein the critical dimension indicates the impact of line end shortening.

17. The computer program product of claim 16, wherein the line implements a gate and the second location is outside a diffusion area implementing the active area.

18. The computer program product of claim 16, wherein the line implements a gate and the second location indicates a portion of the gate over which electrons would normally not flow during operation of the gate.

19. The computer program product of claim 16, wherein the computer readable program code that simulates includes computer readable program code that analyzes evaluation points on the line at the second location.

20. The computer program product of claim 19, wherein the computer readable program code that measures the second critical dimension includes computer readable program code that generates a report including a distance between evaluation points.

21. The computer program product of claim 16, wherein the computer readable program code that determines the layout distance includes:
computer readable program code that determines a process deviation margin, wherein the process deviation margin indicates the second location.

22. A method of determining an impact of line end shortening on a feature, the method comprising:
simulating printing of predetermined points on the feature to determine line end shortening; and
measuring a critical dimension at a predetermined location on the feature, based on the simulating, wherein the predetermined location is associated with device performance, and wherein the predetermined location is outside an active region associated with the feature.

23. The method of claim 22, wherein determining a layout distance and a process deviation margin associated with the active region provides the predetermined location.

24. The method of claim 23, wherein the feature implements a gate and the layout distance is coincident with an edge of the active region that implements a diffusion area associated with the gate.

25. The method of claim 22, further including simulating printing of evaluation points at the predetermined location.

26. The method of claim 22, further including measuring a distance between the simulated printing of evaluation points, wherein the distance is the critical dimension.

27. The method of claim 22, wherein the feature implements a gate and the active region implements a diffusion area associated with the gate.

28. A mask for fabricating an integrated circuit, the mask comprising:
a plurality of gates,
wherein a gate has a first length based on a set endcap margin, the set endcap margin determined by an impact of line end shortening on the gate, the line end shortening being determined by simulating printing of predetermined points on the gate, and
wherein the first length is less than a second length for the gate based on a defined endcap margin provided by a design rule.

* * * * *